(12) United States Patent
Homol et al.

(10) Patent No.: US 7,003,065 B2
(45) Date of Patent: *Feb. 21, 2006

(54) PLL CYCLE SLIP DETECTION

(75) Inventors: David Homol, Chandler, AZ (US);
Theron Jones, Apex, NC (US);
Nikolaus Klemmer, Apex, NC (US)

(73) Assignee: Ericsson Inc., Research Triangle Park, NC (US)

( * ) Notice: Subject to any disclaimer, the term of this patent is extended or adjusted under 35 U.S.C. 154(b) by 816 days.

This patent is subject to a terminal disclaimer.

(21) Appl. No.: 09/803,334

(22) Filed: Mar. 9, 2001

(65) Prior Publication Data

US 2002/0126787 A1 Sep. 12, 2002

(51) Int. Cl.
*H03D 3/24* (2006.01)

(52) U.S. Cl. .................. 375/376; 375/354; 375/371; 375/374; 331/10; 331/12; 331/16; 327/10; 327/149

(58) Field of Classification Search ............... 375/376, 375/354, 371, 374; 331/25, 1 A, 2, 7, 12, 331/16, 27; 327/10, 149
See application file for complete search history.

(56) References Cited

U.S. PATENT DOCUMENTS

| | | | | |
|---|---|---|---|---|
| 3,723,889 A | * | 3/1973 | Oberst ........................... | 327/10 |
| 4,901,026 A | * | 2/1990 | Phillips et al. ................. | 327/10 |
| 4,902,920 A | | 2/1990 | Wolaver ........................ | 327/12 |
| 5,890,051 A | | 3/1999 | Hadjichristos et al. ......... | 455/76 |
| 6,265,902 B1 | * | 7/2001 | Klemmer et al. ............... | 327/2 |
| 6,441,691 B1 | * | 8/2002 | Jones et al. .................... | 331/25 |

FOREIGN PATENT DOCUMENTS

| WO | WO 9965146 | 6/1999 |
|---|---|---|
| WO | WO 02073806 | 9/2002 |

OTHER PUBLICATIONS

Den Dulk R C: "Digital PLL Lock-Detection Circuit" Electronic Letters, IEEE Stevenage, GB, vol. 14, No. 24, Jul. 7, 1988, pp. 880-882, XP002078701 ISSN: 0013-5194.

* cited by examiner

*Primary Examiner*—Shuwang Liu
(74) *Attorney, Agent, or Firm*—Coats & Bennett, P.L.L.C.

(57) ABSTRACT

A cycle slip detector interfaces with a phase/frequency detector (PFD), such as might be used in a phase-locked loop circuit (PLL), and indicates when cycle slips occur in the PFD. Typically, the PFD generates output control signals as a function of the phase difference between first and second input signals, with the first input signal usually serving as a reference signal against which the PLL adjusts the second input signal. The PFD provides linear phase comparison between its input signals, provided their relative phase difference does not exceed ±2π radians. If one of the two signals leads or lags the other by more than that amount, a cycle slip occurs, and the PFD responds nonlinearly. The cycle slip detector provides logic for detecting and indicating leading and lagging cycle slips as they occur in the PDF, and is typically implemented as a minimal arrangement of logic gates and flip-flops.

23 Claims, 5 Drawing Sheets

PLL CYCLE SLIP DETECTION

BACKGROUND OF THE INVENTION

The present invention generally relates to frequency synthesis, and particularly relates to PLL-based frequency synthesis.

Radio frequency (RF) communications equipment, such as mobile terminals within a wireless communication system, use precise timing or frequency reference signals to receive and transmit signals. Often, such a reference signal is used to derive additional signals, possibly of higher or lower frequency, but with the stability and accuracy inherent in the reference signal. This frequent need to slave the frequency or timing of one signal to another, or to monitor the phase or frequency difference between two signals, gives rise to specialized circuits, such as the phase-locked loop (PLL).

A general PLL configuration has a controllable oscillator generating an output signal, a detector generating an error signal based on the phase or frequency difference between a feedback signal derived from the output signal and an input reference signal. The PLL generally includes some type of control circuit to adjust the oscillator based on the error signal generated by the detector. In this manner, the oscillator's output signal may be "locked" to the input reference signal. By setting frequency dividing ratios between the reference and the feedback signals, the output signal may be made to have a higher or lower frequency than the input signal. A mobile terminal might generate a stable reference signal with a precisely fixed frequency, and then use a PLL-based frequency synthesizer to generate higher frequency signals used in transmit signal modulation and down conversion of received signals.

Although PLL circuits vary widely in their implementation, the detector generally provides one or more output signals that, in general, are driven by the phase or frequency difference between two periodic input signals. Often, these two input signals represent a reference clock signal and an adjustable clock signal that is locked to the reference clock signal by operation of the PLL. When the detector's output signal(s) are generated as a function of the phase difference between the two input signals, the output signals accurately reflect the phase difference between the two input signals only when that difference is within a defined range. Generally, phase detectors used within PLL circuits cannot provide linear detection when the phase difference between two signals is greater than $\pm 2\pi$ radians.

BRIEF SUMMARY OF THE INVENTION

The present invention is a system and method for detecting cycle slip in a phase/frequency detector (PFD). Cycle slip detectors interface with the PFD and provide cycle slip indicator signals whenever they detect cycle slip within the PFD. The indicator signals may be used to drive additional circuitry that operates to minimize cycle slip induced error in the PFD's output signals, or to alert supervisory or other systems. Typically, the PFD is used in a phase-locked loop (PLL) circuit to determine the phase difference between a reference signal and the output signal of a voltage-controlled oscillator (VCO). The PFD generates output pulses responsive to clock edges in the two input signals, with the output pulses typically used to control current flow in a charge pump or pumps that set the voltage of the VCO.

The PFD typically comprises one input flip-flop or similar latching type circuit for each of the two input signals. The input flip-flops are usually configured for rising-edge operation, thus a rising edge, referred to as a clock transition, in the either of the two input signals will cause the corresponding input flip-flop to generate a latched output signal. The PFD further includes a reset circuit that operates to reset the input flip-flops after both of them have asserted their latched output signals. This action resets both latched output signals. The PFD experiences cycle slip whenever a clock transition occurs in either input signal while the reset signal is asserted. Cycle slip also occurs in the PFD if a second clock transition occurs in one or both input signals before the input flip-flops are reset.

Each cycle slip detector includes slip detection logic for a corresponding input flip-flop in the PFD. The slip detection logic is configured to assert a cycle slip indicator signal based on receiving a clock edge in its corresponding input signal while the reset signal is asserted, or before the PFD has been properly reset. A logic circuit detects whenever a corresponding input flip-flop in the PFD has its output control signal asserted, or when the reset signal is asserted. This detection function operates to provide an output flip-flop with a high data signal if either condition exists. This output flip-flop is clocked by the same input signal that clocks the corresponding input flip-flop in the PFD. Thus, if the output flip-flop receives a clock edge in the corresponding input signal during either condition, it generates a cycle slip indicator signal. Once its data input signal is de-asserted, a subsequent clock edge in the corresponding input signal causes the output flip-flop to clear its cycle slip indicator signal.

DETAILED DESCRIPTION OF THE INVENTION

Figure 1:
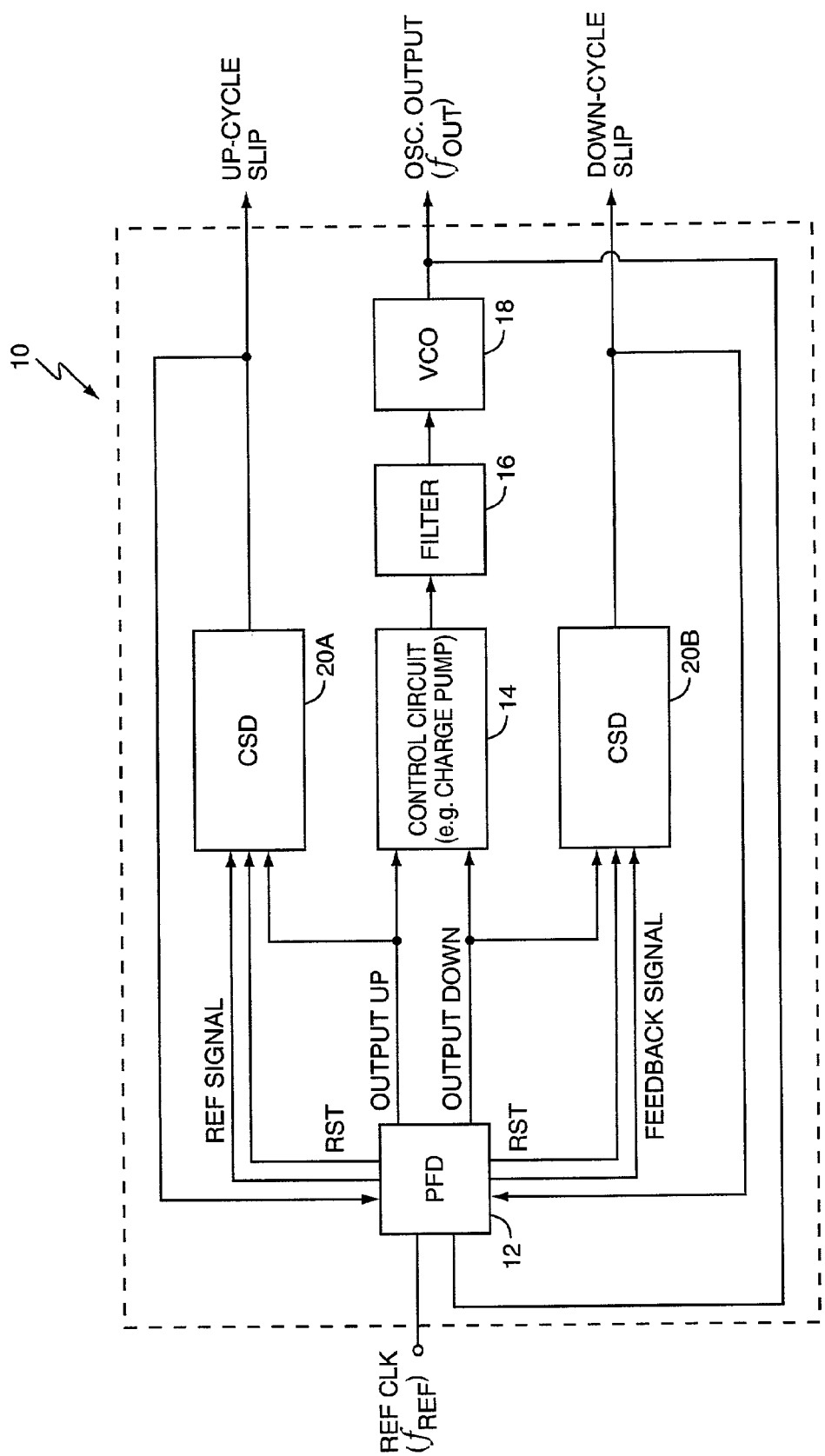
FIG. 1 is a diagram of a phase-locked loop (PLL) including cycle slip detection in accordance with the present invention.

Turning now to the drawings, FIG. 1 is a diagram of a phase-locked loop (PLL), generally referred to by the numeral 10. The PLL 10 comprises a phase/frequency detector (PFD) 12, a control circuit 14, a loop filter 16, a voltage-controlled oscillator (VCO) 18, and cycle slip detectors 20.

In general, the PFD 12 generates PLL control signals based on the phase difference between two input signals. As shown, the PFD 12 receives two input signals, one based on the output from a reference clock (typically a crystal oscillator), and one based on the output signal from the VCO 18. The PLL 10 operates to make the VCO output signal have a frequency that is a desired multiple or fraction of the reference clock's output signal. The PFD 12 generates the PLL control signals as an OUTPUT UP and an OUTPUT DOWN signal for the control circuit 14. The OUTPUT UP and OUTPUT DOWN signals cause the control circuit 14 to adjust the control voltage applied to the VCO 18. The control circuit 14 may, for example, be a charge pump circuit. The loop filter 16 translates the output from the control circuit 14 into a smoothed, voltage-mode control signal for the VCO 18. In this manner, the VCO 18 is controlled as a function of the phase difference between the input signals to the PFD 12.

Depending upon its specific capability, the PFD 12 may operate properly for phase differences of up to ±2π radians, but by nature of its operation, the PFD 12 cannot detect phase differences in excess of this limit in a linear fashion. If the PFD 12 experiences cycle slip, which essentially means that the PFD 12 fails to respond to one or more cycles of either of its input signals, its operation becomes nonlinear. That is, the OUTPUT UP/DOWN signals generated by the PFD 12 no longer reflect the actual phase difference between the input signals. With no ability to detect this cycle slip, the PFD's output signals permanently miss the slipped cycle. The cycle slip detectors 20 operate to detect and indicate cycle slips as they occur in the PFD 12. Cycle slip indicator signals output by the cycle slip detectors 20 may be used to alert other circuitry within the host system (not shown), or may be used to drive error correction circuitry (not shown) in the PFD 12.

Figure 2:
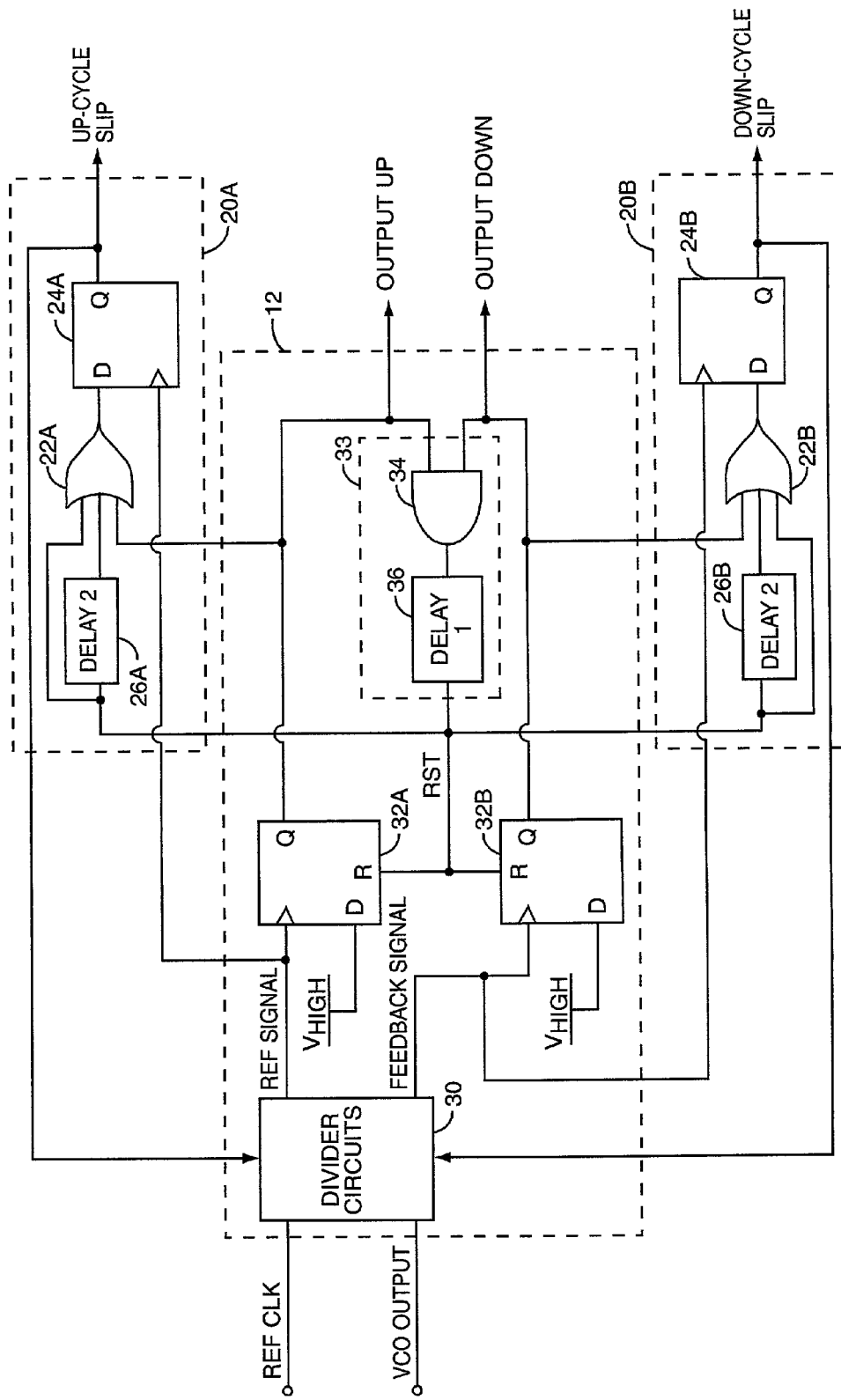
FIG. 2 is a diagram of the cycle slip detector (CSD) and phase/frequency (PFD) detector of FIG. 1.

Turning now to FIG. 2, the cycle slip detectors 20 include an up-slip detector 20A and a down-slip detector 20B. The up-slip detector 20A detects cycle slips in the PFD 12 with respect to the reference signal, while the down-slip detector 20B detects cycle slips in the PFD 12 with respect to the feedback signal. The up-slip detector 20A includes a logic gate 22A, an output flip-flop 24A, and a delay element 26A. Similarly, the down-slip detector 20B includes a logic gate 22B, an output flip-flop 24B, and a delay element 26B. The PFD 12 comprises an optional input divider 30, input flip-flops 32A and 32B, and a reset circuit 33, comprising logic gate 34 and delay element 36.

If used, the divider circuit 30 operates to independently divide down the output signal from a reference clock to produce a reference signal. The divider circuit 30 also divides down the output signal from the VCO 18 to produce the feedback signal. The divider 30 allows the PFD 12 to operate at lower frequencies, and provides a straightforward mechanism for setting the frequency of the output signal from the VCO 18 to a desired fraction or multiple of the reference frequency. Additionally, the divider circuit 30 may be made responsive to the UP- and DOWN-CYCLE SLIP signals output by up-slip detector 20A and down-slip detector 20B, respectively, to correct for detected cycle slips. The co-pending United States patent application entitled, "PLL Cycle Slip Compensation," details exemplary cycle slip compensation based on the cycle slip indicator signals, and is incorporated herein by reference.

The two input flip-flops 32A and 32B are made responsive to either the rising edges or falling edges in the two input signals, the reference and feedback signals. As shown, the two input flip-flops 32A and 32B are rising-edge sensitive. Because its data input is tied high, the input flip-flop 32A asserts its OUTPUT UP signal on a clock transition (rising edge) in the reference signal. Similarly, the input flip-flop 32B asserts its OUTPUT DOWN signal on a clock transition (rising edge) in the feedback signal. With their data inputs fixed high, the two input flip-flops 32A and 32B are unresponsive to subsequent clock transitions in the reference and feedback signals, respectively, until reset via their asynchronous reset inputs.

The reset circuit 33 comprises logic gate 34 and delay element 36 and provides the reset signal RST to the input flip-flops 32A and 32B. In operation, the logic gate 34 asserts its output whenever both OUTPUT UP and OUTPUT DOWN are latched high by the input flip-flops 32A and 32B. A short delay after the logic gate 34 asserts its output signal the delay element 36 asserts its output signal, RST, which resets the input flip-flops 32A and 32B. This reset action de-asserts both OUTPUT UP and OUTPUT DOWN, and makes the input flip-flops 32A and 32B responsive to the next clock transitions in the reference and feedback signals, respectively.

The delay element 36 determines the delay between assertion of the output signal from the logic gate 34 and assertion of the RST signal. As soon as the delay element 36 asserts its output signal RST, the OUTPUT UP and OUTPUT DOWN signals are de-asserted, which causes the logic gate 34 to de-assert its output signal to the delay element 34. In response to this, the delay element 36 de-asserts its RST signal after its programmed delay. In this manner, the delay circuit 36 defines the width of the RST signal pulse, which has the net effect of defining the minimum pulse width that occurs on both OUTPUT UP and OUTPUT DOWN signals. Imposing a minimum pulse width on these signals enhances linear operation of the PFD 12 when the actual phase difference between the reference and feedback signals is quite small. Without benefit of the minimum reset delay imparted by the delay element 36, either OUTPUT UP or OUTPUT DOWN would have too narrow a pulse width to effectively control the control circuit 14, particularly when it is implemented as a charge pump circuit.

As a charge pump circuit, the control circuit 14 causes current to flow into the loop filter 16 when the OUTPUT UP signal is asserted. This action raises the DC voltage output by the loop filter 16, causing the VCO 18 to increase the frequency of its output signal, which increases the frequency of the feedback signal. Conversely, the control circuit 14 sinks current from the loop filter 16 when the OUTPUT DOWN signal is asserted, causing the VCO 18 to decrease the frequency of its output signal. Thus, when the reference signal leads the feedback signal, the output pulses in OUTPUT UP are wider than the pulses in OUTPUT DOWN, and the voltage applied to the VCO 18 by the control circuit 14 gradually increases. When the reference signal lags the feedback signal, the pulses in OUTPUT DOWN are wider than the pulses in OUTPUT UP, and the voltage applied to the VCO 18 by the control circuit 14 gradually decreases.

As noted, the up-slip detector 20A corresponds to the reference signal and to the input flip-flop 32A, and the down-slip detector 20B corresponds to the feedback signal and the input flip-flop 32B. Operation of the up-slip detector 20A is discussed in detail, but it should be understood that the discussion fully applies to down-cycle slip detection for the feedback signal using the down-slip detector 20B.

Figure 3:
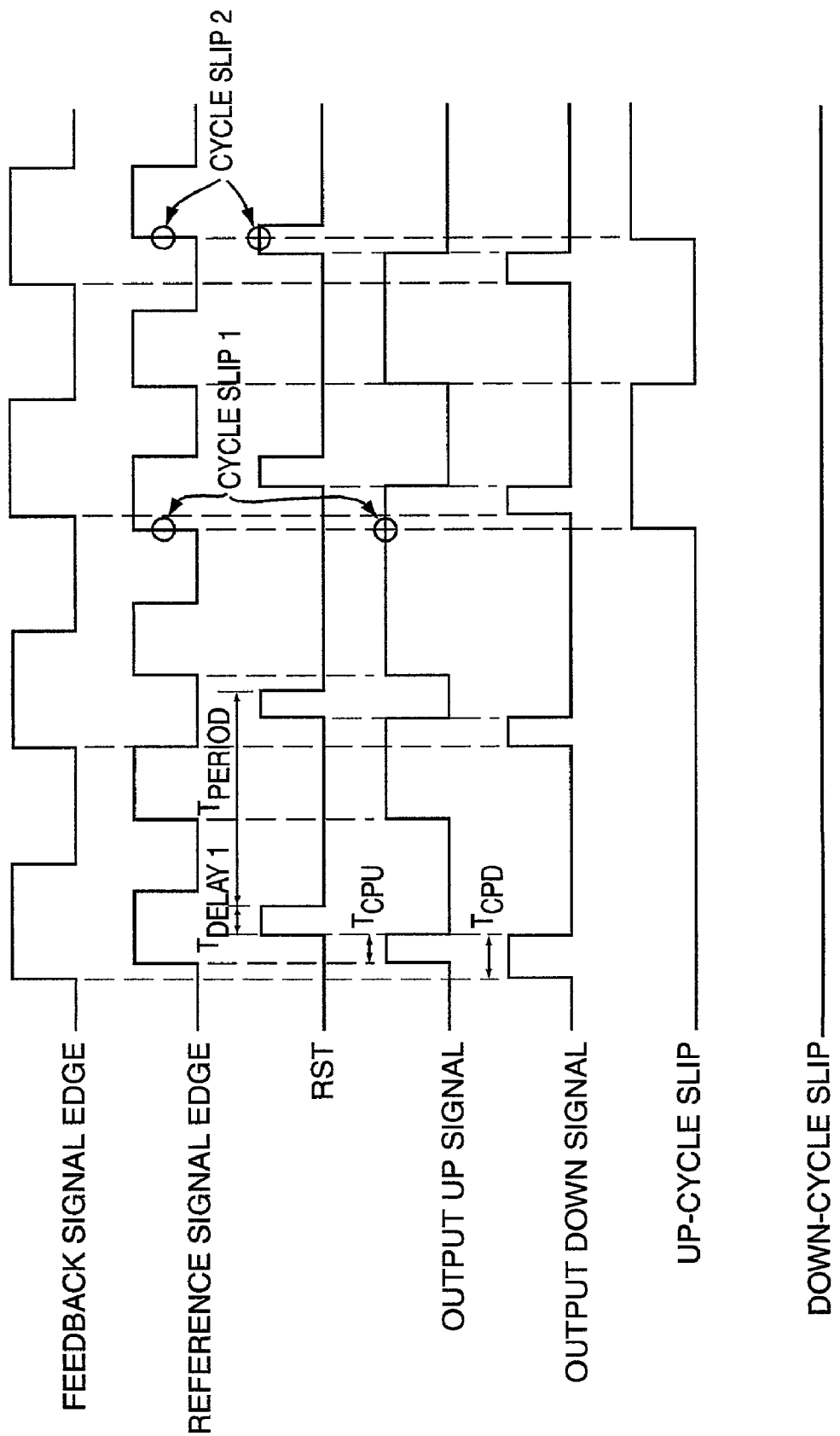
FIG. 3 is a diagram of relevant operating waveforms for the PFD and CSD of FIG. 2.

Turning now to FIG. 3, a time-aligned series of operating waveforms includes: the reference and feedback signals; the RST signal; the two control signals OUTPUT UP and OUTPUT DOWN; and the two cycle-slip indicator signals UP-CYCLE SLIP and DOWN-CYCLE SLIP.

The left side of the signal waveforms depicts normal operation of the PFD 12. The reference and feedback signals are latched by the input flip-flops 32A and 32B, respectively. Thus, the input flip-flop 32A asserts its OUTPUT UP signal on the first clock edge of the reference signal, while the input flip-flop 32B asserts its OUTPUT DOWN signal on the first clock edge in the feedback signal. Once both OUTPUT UP and OUTPUT DOWN are asserted, the logic gate 34 asserts its output signal. However, delay in the delay element 36 prevents an immediate assertion of RST, which allows OUTPUT UP to remain asserted a minimum time $T_{CPU}$. Once RST is asserted, both OUTPUT UP and OUTPUT DOWN return low, and the PFD 12 is ready for the next clock edges in the reference and feedback signals.

The frequency difference between the reference and feedback signals is such that the PFD 12 is presented with two reference signal clock edges between RST pulses. These are termed first and second clock edges for the following discussion. The first and second clock edges occur between the second and third RST pulses, moving from left to right. From the earlier description of the PFD 12, it should be understood that the input flip-flop 32A does not respond to the second clock edge, as the first clock edge latched its OUTPUT UP signal high. Consequently, the PFD 12 misses the second clock edge, causing Cycle Slip 1. Note that PFD 12 manifests Cycle Slip 1 by incorrectly controlling its OUTPUT UP signal. Specifically, the PFD 12 fails to re-assert the OUTPUT UP signal as it should have in response to the missed clock edge.

The up-slip detector 20A detects Cycle Slip 1 and asserts its UP-CYCLE SLIP output signal. Specifically, the logic gate 22A drives the data input of the output flip-flop 24A high as long as the OUTPUT UP signal is asserted. By design, the PFD 12 asserts and holds the OUTPUT UP signal high upon occurrence of the first clock edge. Thus, the second clock edge clocks the output flip-flop 24A while its data input is high, causing it to assert its output signal, UP-CYCLE SLIP.

The second cycle slip, labeled Cycle Slip 2, also occurs with respect to the reference signal, but occurs for different reasons. Here, a reference signal clock edge occurs during the RST pulse. The input flip-flops 32A and 32B are not responsive when their reset input is actively driven, and thus the PFD 12 misses this transition in the reference signal. Note that the PFD 12 manifests Cycle Slip 2 by failing to assert the OUTPUT UP signal in response to the missed clock edge.

Note that the present invention relates to the co-pending application entitled "Slip-Detecting Phase Detector and Method for Improving Phase-Lock Loop Lock Time," Ser. No. 09/432,987, which was filed on Nov. 2, 1999. The disclosure of this co-pending application is incorporated herein by reference. While related to the subject matter of this earlier filed application, the present invention considers a comprehensive range of conditions that cause, or may cause cycle slip, including circumstances associated with reset conditions of the PFD 12.

The up-slip detector 20A detects Cycle Slip 2 and asserts its UP-CYCLE SLIP output signal. Specifically, the logic gate 22A drives the data input of the output flip-flop 24A high as long as the RST signal asserted, as it is during the reset pulse. With the logic gate 22A driving its data input high during the RST pulse, the output flip-flop 24A asserts its output signal, OUTPUT UP, if it receives a reference signal clock edge.

If a reference signal clock edge occurs just as the RST pulse is ending, the logic gate 22A might not keep the data input of the output flip-flop 24A asserted long enough for that clock edge to register a high at the output of the flip-flop 24A. In effect, the up-slip detector 20A would not reliably register cycle slips occurring at the falling edge of the RST pulse. The delay element 26A overcomes this problem by slightly extending the hold time on the falling edge of the RST pulse. The output signal of the delay element 26A drives an input of the logic gate 22A, with the logic state of this output signal always lagging that of the RST signal by a defined delay. The net effect of this delay is to cause the logic gate 22A to continue asserting its output signal for a short period after the RST pulse falls. This delay is small, and will be determined based on the hold timing of the flip-flop 24A, and may include other timing considerations as well.

As noted, the above discussion of operation also applies to the detection of down-cycle slips using the down-slip detector 20B. Thus, the cycle slip scenarios discussed above with regard to the reference signal equally apply to the feedback signal. Further, it must be noted that while the cycle slip detectors 20 are shown separate from the PFD 12, they may be incorporated within the PFD 12 if, for example, the PFD 12 provides cycle slip compensation like that presented in the previously incorporated co-pending application.

Figure 4:
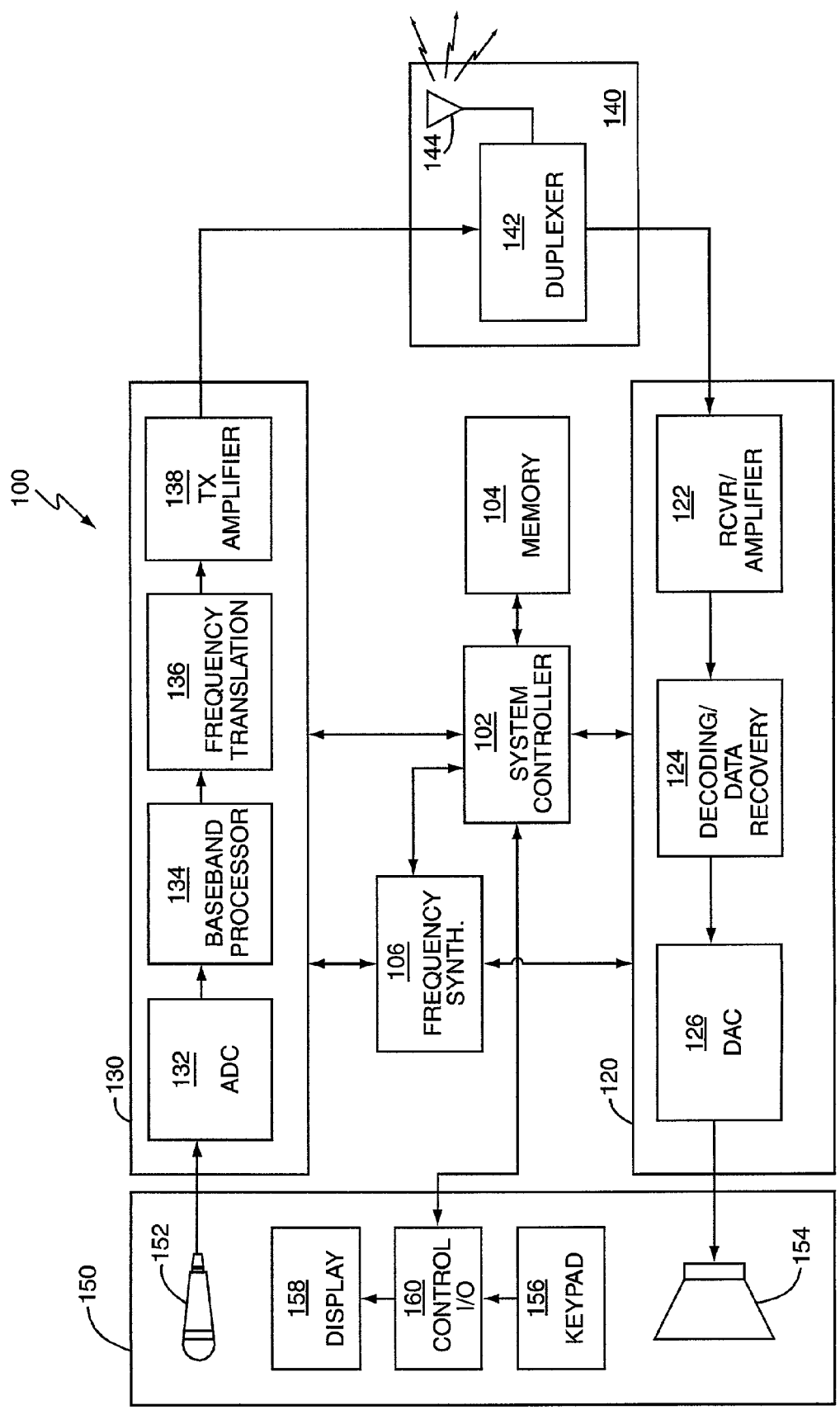
FIG. 4 is a diagram of a mobile terminal incorporating the PLL of FIG. 1.

FIG. 4 is a simplified diagram of a mobile terminal used in a wireless communications network, such as a cellular radiotelephone network, and is generally indicated by the numeral 100. The mobile terminal 100 includes a system controller 102 and associated memory 104, a frequency synthesizer 106, a receiver 120, a transmitter 130, a duplexer/antenna 140, and a user interface 150. The frequency synthesizer 106 is implemented in accordance with the present invention.

In operation, the mobile terminal 100 sends and receives information via radio frequency signaling between it and a remote base station (not shown). The system controller 102 is typically implemented as one or more microcontrollers (MCUs) that manage the user interface 150, and provide overall control of the mobile terminal 100. The memory 104 generally includes application software, default values for constants used in operation, and working space for data.

The user interacts with the mobile terminal 100 via the user interface 150. The microphone 152 converts user speech signals into a corresponding analog signal, which is provided to the transmitter 130 for subsequent conversion, processing, and transmission to the remote base station via the duplexer/antenna 140. The receiver 120 receives signals from the remote base station and extracts received audio information, e.g., speech from a remote user, and provides an audio signal for driving a speaker 154 included in the user interface 150. The user interface 150 further includes a keypad 156 for accepting commands and data input from the user, and a display 158 for providing visual information to the user. In short, the user interface 150 allows the user to send and receive speech and other audio information, to dial numbers, and to enter other data as needed.

The receiver 120 includes a receiver/amplifier 122, a decoding/data recovery module 124, and a digital-to-analog converter (DAC) 126. In operation, signals are received via the antenna 144, and the duplexer 142 provides signal isolation between received and transmitted signals. Received signals are routed to the receiver amplifier 122, which provides conditioning, filtering, and down conversion of the received signal. In digital implementations, the receiver/amplifier 122 may use analog-to-digital converters (ADCS) to provide the decoding/data recovery module 124 with successive digital values corresponding to the incoming received signal. The decoding/data recovery module 124 recovers the audio information encoded in the received signal, and provides the DAC 126 with digital values corresponding to the received audio information. In turn, the DAC 126 provides an analog output signal suitable for driving the speaker 154.

The transmitter 130 includes an ADC 132, a baseband processor 134, a frequency translation module 136, and a transmit amplifier 138. In operation, the ADC 132 converts analog speech signals from the microphone 152 to corresponding digital values. The baseband processor 134 processes and encodes these digital values, providing error correction encoding and translation into a format suitable for the frequency translation module 136. The frequency translation module 136 provides the transmit amplifier 138 with a modulated carrier signal at the desired transmit frequency. In turn, the transmit amplifier 138 generates the RF output signal $RF_{OUT}$ for transmission to the remote base station via the duplexer/antenna 140.

The frequency synthesizer provides one or more frequency signals for use in the mobile terminal 100. Typically, the frequency synthesizer 106 generates reference frequency signals that are used in received signal down conversion, and in transmit signal modulation. The frequency synthesizer 106 uses one or more PLLs 10 to generate these signals.

Figure 5:
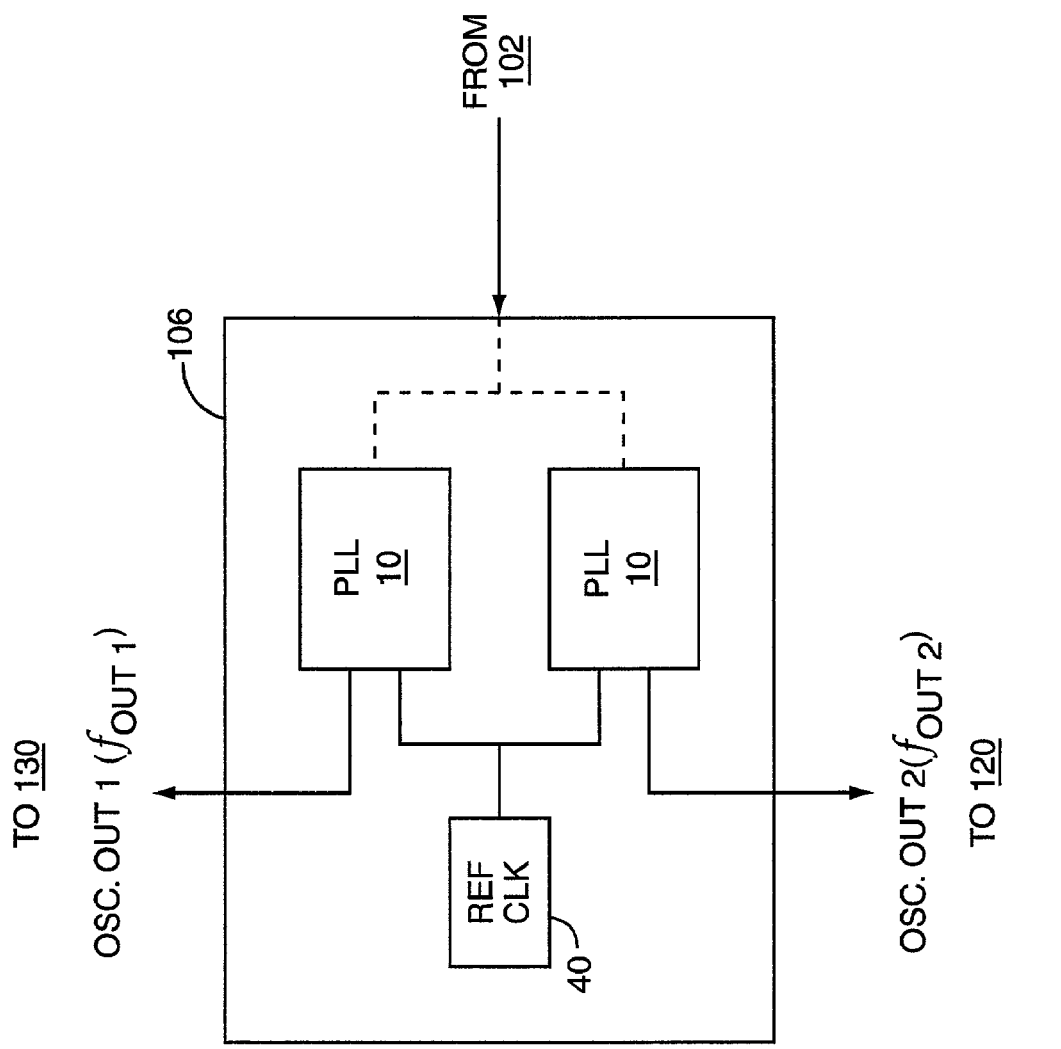
FIG. 5 is a diagram of the frequency synthesizer in the mobile terminal of FIG. 4.

FIG. 5 is a diagram of the frequency synthesizer 106. The frequency synthesizer 106 includes two or more PLLs 10, and a reference clock 40. At least one of the PLLs 10 incorporates the PFD 12 and up-/down-cycle slip detectors 20A and 20B as discussed above. With regard to the earlier discussion, the upper PLL 10 derives its reference signal from the reference clock 40 and derives its feedback signal from the output signal OSC OUT 1. Likewise, the lower PLL 10 derives its reference signal from the reference clock 40 and derives its feedback signal from the output signal OSC OUT 2. As noted above, the frequency synthesizer 106 may incorporate additional PLLs 10, to provide multiple reference frequencies for use in received signal processing or transmit signal generation.

The frequency synthesizer 106 operates under control of the MCU 102, with the MCU 102 setting, for example, the divider ratios used by the divider circuits 30 in both PLLs 10 to control the frequency of OSC OUT 1 and OSC OUT 2. The MCU 102 might also monitor one or more of the PLLs 10 for cycle slip events as indicated by the UP-CYCLE and DOWN-CYCLE SLIP indicator signals described earlier. Such monitoring might, for example, provide the MCU 102 with the ability to estimate the time required for achieving a locked condition in the affected PLL 10.

The present invention may, of course, be carried out in other specific ways than those herein set forth without departing from the spirit and essential characteristics of the invention. The present embodiments are, therefore, to be considered in all respects as illustrative and not restrictive, and all changes coming within the meaning and equivalency range of the appended claims are intended to be embraced therein.

What is claimed is:

1. A circuit for use in a phase-locked loop (PLL) comprising:
    a phase detector comprising:
        first and second input circuits to generate first and second PLL control signals responsive to clock edges in first and second input signals, respectively; and
        a reset circuit to generate a reset signal based on said first and second PLL control signals to reset said first and second input circuits; and
    a cycle slip detector for each one of said first and second input circuits, each said cycle slip detector generating a slip indication signal based on said reset signal, a corresponding one of said first and second input signals, and a corresponding one of said first and second PLL control signals; and
    wherein each said cycle slip detector comprises slip detection logic to generate said slip indication signal when a clock edge in said corresponding one of said first and second input signals is received during said reset signal.

2. The circuit of claim 1 wherein said slip detection logic comprises a delay element to generate a delayed version of said reset signal, and wherein said slip detection logic additionally generates said slip indication signal in response to receiving a clock edge in said corresponding one of said first and second input signals when said delayed version of said reset signal is asserted.

3. The circuit of claim 1 wherein each said slip detection logic comprises logic to generate said slip indication signal when a clock edge in said corresponding one of said first and second input signals is received when said corresponding one of said first and second PLL control signals is asserted.

4. The circuit of claim 1 wherein each said cycle slip detector comprises slip detection logic, said slip detection logic comprising:
    an output flip-flop with a clock input coupled to said corresponding one of said first and second input signals; and
    a logic gate with a first logic input coupled to said reset signal and a second logic input coupled to said corresponding one of said first and second PLL control signals, and with a logic output coupled to a data input of said output flip-flop, said logic gate operative to assert said logic output whenever at least one of said reset signal and said corresponding one of said first and second PLL control signals is asserted.

5. The circuit of claim 4 wherein said slip detection logic further comprises a delay element coupled to said reset signal and operative to generate a delayed version of said reset signal, said logic gate including a third logic input coupled to said delay element to receive said delayed version of said reset signal and operative to assert said logic output whenever said delayed version of said reset signal is asserted.

6. The circuit of claim 1 wherein each said first and second input circuits comprises a latching circuit generating a corresponding one of said first and second PLL control signals as a latched output signal responsive to a first clock edge in a corresponding one of said first and second input signals.

7. The circuit of claim 6 wherein said latching circuit comprises a reset input coupled to said reset signal and operative to reset said latched output signal when said reset signal is asserted so that said latching circuit responds to a next clock edge in said corresponding one of said first and second input signals.

8. The circuit of claim 6 wherein said latching circuit comprises an input flip-flop configured such that:
    a data input of said input flip-flop is coupled to a fixed assertion signal;
    a data output of said input flip-flop is coupled to an input of said reset circuit and to an input of said slip detection logic in a corresponding one of said cycle slip detectors;
    a clock input of said input flip-flop is coupled to said corresponding one of said first and second input signals; and
    a reset input coupled to a reset signal output of said reset circuit.

9. The circuit of claim 1 wherein said reset circuit comprises:
    a logic gate with first and second inputs coupled to first and second PLL control signals from said first and second input circuits, and operative to assert an output signal when both said first and second control signals are asserted; and a delay element to generate said reset signal a defined delay after assertion of said output signal from said logic gate.

10. A phase-locked loop (PLL) comprising:

a phase detector to generate first and second PLL control signals based on a detected phase difference between respective clock edges in first and second input signals, said phase detector comprising:

first and second input circuits to generate first and second PLL control signals responsive to clock edges in first and second input signals, respectively; and a reset circuit to generate a reset signal based on said first and second PLL control signals to reset said first and second input circuits; and a control circuit to generate a control signal based on said first and second PLL control signals;

a controllable oscillator to generate an output signal at a frequency based on said control signal; and a first cycle slip detector to generate a first cycle slip indicator signal when a clock edge in said first input signal occurs during said reset signal; and a second cycle slip detector to generate a second cycle slip indicator when a clock edge in said second input signal occurs during said reset signal;

wherein said first input signal is derived from a reference clock signal and said second input signal is derived from a frequency-controlled output of said PLL.

11. The PLL of claim 10 wherein said first and second cycle slip detectors each comprise slip detection logic, said slip detection logic comprising:

an output flip-flop with a clock input coupled to a corresponding one of said first and second input signals; and a logic gate with a first logic input coupled to said reset signal and a second logic input coupled to a corresponding one of said first and second PLL control signals, and with a logic output coupled to a data input of said output flip-flop, said logic gate operative to assert said logic output whenever at least one of said reset signal and said corresponding one of said first and second PLL control signals is asserted.

12. The PLL of claim 11 wherein said slip detection logic further comprises a delay element coupled to said reset signal and operative to generate a delayed version of said reset signal, said logic gate including a third logic input coupled to said delay element to receive said delayed version of said reset signal and operative to assert said logic output whenever said delayed version of said reset signal is asserted.

13. The PLL of claim 10 wherein each said first and second input circuits comprises a latching circuit generating a corresponding one of said first and second PLL control signals as a latched output signal responsive to a first clock edge in a corresponding one of said first and second input signals.

14. The PLL of claim 13 wherein said latching circuit comprises a reset input coupled to said reset signal and operative to reset said latched output signal when said reset signal is asserted so that said latching circuit responds to a next clock edge in said corresponding one of said first and second input signals.

15. The PLL of claim 13 wherein said latching circuit comprises an input flip-flop configured such that:

a data input of said input flip-flop is coupled to a fixed assertion signal;

a data output of said input flip-flop is coupled to an input of said reset circuit and to an input of said slip detection logic in a corresponding one of said cycle slip detectors;

a clock input of said input flip-flop is coupled to said corresponding one of said first and second input signals; and a reset input coupled to a reset signal output of said reset circuit.

16. A radio transceiver comprising:

a receiver to receive a remotely transmitted signal at a receive frequency;

a transmitter to generate a transmit signal at a carrier frequency; and a frequency synthesizer to generate a first output signal bearing on said receive frequency and a second output signal bearing on said carrier frequency, said frequency synthesizer comprising:

a reference clock circuit to generate a reference clock signal; and first and second phase-locked loops (PLLs) to generate said first and second output signals, respectively, at least one of said first and second PLLs comprising:

a phase detector to generate first and second PLL control signals based on a detected phase difference between respective clock edges in first and second input signals, said first input signal derived from said reference clock signal and said second input signal derived from a corresponding one of said first and second output signals from said frequency synthesizer, said phase detector comprising:

first and second input circuits to generate first and second PLL control signals responsive to said clock edges in said first and second input signals, respectively; and a reset circuit to generate a reset signal based on said first and second PLL control signals to reset said first and second input circuits; and a control circuit to generate a control signal based on said first and second PLL control signals;

a controllable oscillator to generate said corresponding one of said first and second output signals at a frequency based on said control signal; and a first cycle slip detector to generate a first cycle sup indicator signal when a clock edge in said first input signal occurs during said reset signal; and a second cycle slip detector to generate a second cycle slip indicator when a clock edge in said second input signal occurs during said reset signal.

17. The radio transceiver of claim 16 wherein said first and second cycle slip detectors each comprise slip detection logic, said slip detection logic generating a corresponding one of said first and second cycle slip indicator signals when a clock edge is received in a corresponding one of said first and second input signals while at least one of said reset signal and a corresponding one of said first and second PLL control signals is asserted.

18. A method of detecting cycle slip in a phase detector circuit, the method comprising:

operating said phase detector to generate first and second PLL control signals based on latching respective first clock edges in first and second input signals;

resetting said phase detector with a reset pulse after both said first clock edges occur to make said phase detector responsive to next clock edges in said first and second input signals;

generating a slip indicator signal in response to at least one of said next clock edges occurring before said reset pulse, and in response to any clock edge in at least one of said first and second input signals occurring during said reset pulse.

19. The method of claim 18 wherein generating a slip indicator signal in response to said at least one of said next clock edges occurring before said reset pulse, and in response to any clock edge in at least one of said first and second input signals occurring during said reset pulse comprises:

generating a first cycle slip indicator signal if said at least one of said next clock edges occurs in said first input signal before said reset pulse, and if said any clock edge occurs in said first input signal during said reset pulse; and generating a second cycle slip indicator signal if said at least one of said next clock edges occurs in said second input signal before said reset pulse, and if said any clock edge occurs in said second input signal during said reset pulse.

20. The method of claim 18 further comprising:

deriving a delayed reset pulse from said reset pulse;

detecting whether any clock edges occur in at least one of said first and second input signals during said delayed reset pulse; and generating said cycle slip indicator signal in response to said any clock edges occurring during said delayed reset pulse.

21. The method of claim 18 further comprising determining whether a missed clock edge is an up-cycle slip or a down-cycle slip based on determining whether said phase detector misses a clock edge in said first input signal or in said second input signal, respectively.

22. The method of claim 21 further comprising generating said cycle slip indicator signal as an up-cycle slip indicator upon occurrence of said up-cycle slip and generating said cycle slip indicator signal as a down-cycle slip indicator upon occurrence of said down-cycle slip.

23. The method of claim 21 further comprising:

deriving a delayed reset pulse from said reset pulse;

detecting whether a clock edge occurs in said first input signal during said delayed reset pulse;

generating said up-cycle slip indicator in response to said clock edge occurring in said first input signal during said delayed reset pulse;

detecting whether a clock edge occurs in said second input signal during said delayed reset pulse; and generating said down-cycle slip indicator in response to said clock edge occurring in said second input signal during said delayed reset pulse.

* * * * *